(12) United States Patent
Nagatani

(10) Patent No.: US 10,658,155 B2
(45) Date of Patent: May 19, 2020

(54) PHASE CONTRAST TRANSMISSION ELECTRON MICROSCOPE DEVICE

(71) Applicant: INTER-UNIVERSITY RESEARCH INSTITUTE CORPORATION NATIONAL INSTITUTES OF NATURAL SCIENCES, Tokyo (JP)

(72) Inventor: Yukinori Nagatani, Okazaki (JP)

(73) Assignee: Inter-University Research Institute Corporation National Institutes of Natural Sciences, Tokyo (JP)

( * ) Notice: Subject to any disclaimer, the term of this patent is extended or adjusted under 35 U.S.C. 154(b) by 0 days.

(21) Appl. No.: 16/089,426

(22) PCT Filed: Mar. 28, 2017

(86) PCT No.: PCT/JP2017/012654
§ 371 (c)(1),
(2) Date: Sep. 28, 2018

(87) PCT Pub. No.: WO2017/170558
PCT Pub. Date: Oct. 5, 2017

(65) Prior Publication Data
US 2019/0122855 A1    Apr. 25, 2019

(30) Foreign Application Priority Data

Mar. 30, 2016 (JP) ................................. 2016-069638

(51) Int. Cl.
*H01J 37/295* (2006.01)
*H01J 37/26* (2006.01)
(Continued)

(52) U.S. Cl.
CPC ............ *H01J 37/295* (2013.01); *H01J 37/22* (2013.01); *H01J 37/244* (2013.01); *H01J 37/26* (2013.01);
(Continued)

(58) Field of Classification Search
CPC ........ H01J 37/295; H01J 37/22; H01J 37/244; H01J 37/26; H01J 2237/2614; H01J 2237/2482; H01J 37/10
See application file for complete search history.

(56) References Cited

U.S. PATENT DOCUMENTS 7,119,953 B2 * 10/2006 Yun ..................... A61B 6/484
359/385
2007/0223553 A1 * 9/2007 Liu ....................... H01S 3/0941
372/70

(Continued)

FOREIGN PATENT DOCUMENTS

JP    2006-114348 A    4/2006
JP    2012-003843 A    1/2012

OTHER PUBLICATIONS

International Search Report of PCT/JP2017/012654 dated Mar. 29, 2017.

*Primary Examiner* — Brooke Purinton
(74) *Attorney, Agent, or Firm* — Mattingly & Malur, PC

(57) ABSTRACT

A phase contrast transmission electron microscope apparatus has a long-life phase modulator, enabling changes in quantity of phase modulation, barely absorbing the electron beams, and not being influenced by irradiation of the electron beams. An electron microscope comprises an electron gun, a first laser beam irradiating process, being positioned between the electron source and an object lens, for irradiating laser beams onto the electron beams radiated from the electron gun, a second laser beam irradiating process, being positioned on a focal plane behind the object lens, for focusing and irradiating the laser beams upon the focus of the electron beams penetrating through a specimen, and a screen or a 2D electron sensor for detecting a specimen image in the form of distribution of intensity of the electron beams by an optical system.

12 Claims, 7 Drawing Sheets

(51) Int. Cl.
*H01J 37/22* (2006.01)
*H01J 37/244* (2006.01)
*H01J 37/10* (2006.01)

(52) U.S. Cl.
CPC ....... *H01J 37/10* (2013.01); *H01J 2237/2482* (2013.01); *H01J 2237/2614* (2013.01)

(56) References Cited

U.S. PATENT DOCUMENTS

| | | | | |
|---|---|---|---|---|
| 2011/0121205 A1* | 5/2011 | Kim | ................... | B23K 26/0626 |
| | | | | 250/492.1 |
| 2011/0220791 A1* | 9/2011 | Reed | ....................... | H01J 37/04 |
| | | | | 250/307 |

* cited by examiner

PHASE CONTRAST TRANSMISSION ELECTRON MICROSCOPE DEVICE

TECHNICAL FIELD

The present invention relates to a transmission electron microscope (TEM) apparatus, and in particular, it relates to a phase contrast transmission electron microscope apparatus for observation with converting the phases of electron beams into the contrast thereof.

BACKGROUND ART

The transmission electron microscope for observing an object to be inspected, with applying the electron beams therein, being radiated from an electron gun and penetrating through a specimen, is already known in various kinds of documents, including the following Patent Documents 1 and 2, and so on, for example, and it is widely applied in an observation of nano-metric structure of a thin specimen, etc. Namely, it is a method of observing the structure inside that specimen, by means of the transmission electron microscope; i.e., while irradiating the electron beams upon the specimen, the electron beams penetrating the specimen is projected, enlargedly, on a screen or/and a 2D detector, and there can be obtained a projection image that is reflecting absorption of the electron beams inside the specimen object thereon.

PRIOR TECHNICAL DOCUMENT(S)

Patent Document(s)

Patent Document 1: Japanese Patent Laying-Open No. 2006-114348 (2006); and
Patent Document 2: Japanese Patent Laying-Open No. 2012-3843 (2012).

SUMMARY OF THE INVENTION

Problem(s) to be Solved by the Invention

In such transmission electron microscope, generally, when targeting a soft living organism and/or a resin of non-staining, or the like, which are difficult to create the contrast due to small absorption of the electron beams thereinto, there is applied so-called a defocus phase contrast electron microscope, converting the phases of the electron beams passing through the specimen body into the contrast thereby to be observed, with placing the focus out of the focus by an optimum amount or volume (so-called "Scherzer focus"). This is based on the principle of obtaining an interference contrast, by bringing about a quantum interference effect at a near distance due to the focus shifting, while utilizing an aberration of an object lens aggressively. However, in the case of targeting the soft living organism and/or the resin of non-staining, etc., which is made of a same kind of element(s), as the main component thereof, there is still a drawback that it is difficult to create the contrast on the images obtained.

Conventionally, as the method for solving this, the Zernike phase contrast electron microscopy (see FIG. 6) is applied, whereby converting the phases of the electron beams passing through the specimen object into the contrast thereof with applying the Zernike phase plate, and thereby observing it.

In the Zernike phase contrast electron microscopy shown in this FIG. 6, while irradiating the electron beams upon the specimen with applying an electron gun and a converging optical system, the phase changes of the electron beams due to the specimen are converted into the contrast on a screen, by inserting the Zernike phase plate on the focal plane behind the specimen. The Zernike phase plate has a function of changing relative phases of the electron beams scattered by the specimen, by 90 degrees in the plus (+) or minus (−) direction, with respect to the phase of the focus (e.g. a beam spot) of the electron beams locating at a center on the focal plane, e.g., a phase modulating function.

Heretofore, there were proposed a carbon thin-film type Zernike phase plate, which opens a bore of several $100s$ nm diameter at a center of an amorphous carbon thin-film having several $10s$ nm thickness, a non-bore carbon thin-film type Zernike phase plate, which applies the amorphous carbon thin-film as it is, for applying change of physical properties of the carbon thin-film due to spot radiation of the electron beams onto the phase modulation, and an Einzel lens type phase plate for generating potential difference only at a central portion by means of silicon micromachining technology, and so on.

However, since those phase plates are positioned in the vicinity of a spot of electron beams having strong intensity on the focal plane, the physical properties of those phase plates are changed or deteriorated while passing the time due to the radiation of electron beams. As a result thereof, they have defects that they cannot correctly reproduce the phase contrasts again, and this is acknowledged as a phenomenon of electrification of those phase plates. Namely, those phase plates have a short life-time, and further there is pointed out a drawback that they can be easily broken, instantaneously, in case when the focused electron beams directly contact thereon due to erroneous operation, etc.

In addition thereto, the phase plates also have a secondary effect of absorbing the electron beams therein, other than the inherent function(s) of modulating the phases, and for that reason, they waste a part of the electron beams passing through the specimen, and as a result thereof, have a problem of increasing dose of the electron beams upon the specimen.

Materials of a living body, such as, proteins and/or virus particles, etc., are very weak to the radiation of the electron beams. The electron beams passing through the specimen carry information of the specimen therein, and therefore wasting of the electron beams should be avoided. Because a spatial resolution to the specimen that is weak to the radiation of the electron beams be determined by, not the intensity of the contrast obtainable by the apparatus, i.e., the electron microscope, but by a quantity of the electron beams per a unit of areas where they can be irradiated without giving damages onto the specimen, and the intensity of the contrast obtainable (=the quantity of change of "s" due to the specimen/the quantity of the back), e.g., a Rose limit), then there are required the both, i.e., not only the high contrast, but also not wasting the electron beams passing through the specimen.

Then, the present invention, being accomplished by taking the problems of the conventional arts mentioned above into the consideration thereof, an object thereof is to provide a phase contrast transmission electron microscope apparatus, being superior in the functions thereof and having high contrast, by achieving a phase modulating means, being able to adjust the quantity of phase modulation easily and instantaneously, and also continuously, without absorbing the electrons after passing through the specimen therein, but not easily broken due to the erroneous operation, such as, irradiation of the electron beams thereupon, like the conventional phase plate, and enabling easy handling and having a long lifetime.

Means for Solving the Problem(s)

For accomplishing the object mentioned above, according to the present invention, firstly, there is provided a phase contrast transmission microscope apparatus, comprising: an electron source for radiating electron beams therefrom; an object lens; a specimen holder base for holding a specimen thereon, being positioned between said electron source and said object lens; an image forming optical system being positioned behind said object lens; and means for detecting a specimen image by said image forming optical system, in form of a distribution of intensities of the electron beams, further comprising a first laser beam irradiating means for radiating laser beams having direction of an electric field parallel with propagating direction thereof, onto said electron beams, on a focal plane behind said object lens.

Also, according to the present invention, preferably, the phase contrast transmission microscope apparatus, as defined in the above, further comprises: a first condenser lens for condensing the electron beams radiated from said electron source, being positioned between said electron source and said object lens; and a second laser beam irradiating means for irradiating the laser beams on the focal plane of said first condenser lens, and further, preferably, wherein the laser beam from said second laser beam irradiating means is also a laser beam having direction of an electric field parallel with propagating direction of said electron beam.

And, according to the present invention, preferably, in the phase contrast transmission microscope apparatus, as defined in the above, preferably, the laser beam from said first laser beam irradiating means and the laser beam from said second laser beam irradiating means are laser beams generated from a same laser oscillator, and further, preferably, said same laser oscillator is a single mode laser oscillator. Also, preferably, it further comprises: a third laser beam irradiating means for irradiating a laser beam on a focus of said electron beams before passing through said specimen in a downstream side of irradiation of the laser beams by said second laser beam irradiating means, also, preferably, wherein the laser beam from said third laser beam irradiating means is also a laser beam having direction of an electric field in parallel with propagating direction of said electron beam, and furthermore, wherein, preferably, the laser beam from said first laser beam irradiating means, the laser beam from said second laser beam irradiating means, and the laser beam from said third laser beam irradiating means are laser beams generated from a same laser oscillator. In addition thereto, wherein said same laser oscillator is a single mode laser oscillator, and further wherein said specimen image detecting means includes a screen-type or 2D electron beam sensor, preferably.

In addition thereto, in the phase contrast transmission microscope apparatus, as defined in the above, wherein a picture is detected as changes in phase, changes in amplitude, or visibility due to said specimen are/is detected as a picture, by obtaining plural numbers of pictures while changing parameter(s) of said laser beams to be irradiated.

Effect(s) of the Invention

According to the present invention mentioned above, it is possible to achieve the Zelnike phase plate for use in an electron microscope, being variable in quantity of the phase modulation, minimizing the dose of electron beams upon a specimen, not being damaged due to the irradiation of the electron beams, i.e., having a lifetime substantially not limited, and thereby providing the transmission electron microscope for enabling an imaging of changes in the phase difference due to the specimen material, at high contrast, and for measuring distribution of visibility, as well as, the distribution in phases and amplitudes of the electron beams due to the specimen material, quantitatively.

MODE(S) FOR CARRYING OUT THE INVENTION

Figure 1:
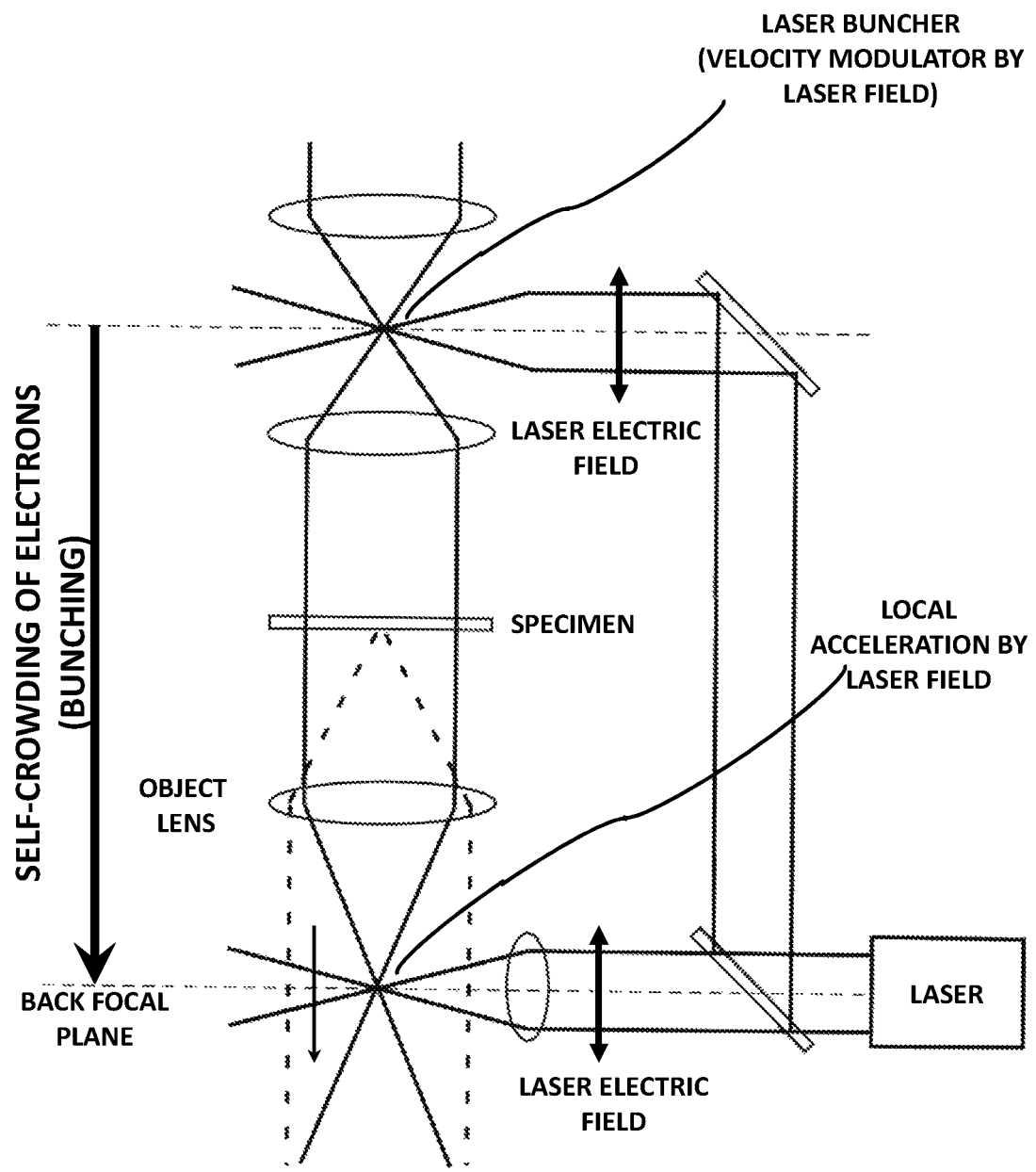
FIG. 1 is a view for explaining the principle of the phase contrast transmission electron microscope according to the present invention.

Hereinafter, detailed explanation will be given about a mode (hereinafter, may be called an "embodiment", too) for carrying out the present invention, by referring to the drawings attached herewith; however, in advance to that, description will be made on the fundamental characteristics and/or the way of thinking according to the present invention.

(Polarizing Laser Phase Contrast TEM)

Firstly, as the fundamental way of thinking of the present invention, a laser focus is introduced onto a back focal plane of the TEM, thereby to operate an electron phase within the back surface, locally, by means of an electric field of that laser, and in that instance, a polarizing direction of the laser is introduced to be in parallel with an axis of electron beams (e.g., progressing direction of the electrons).

Figure 7:
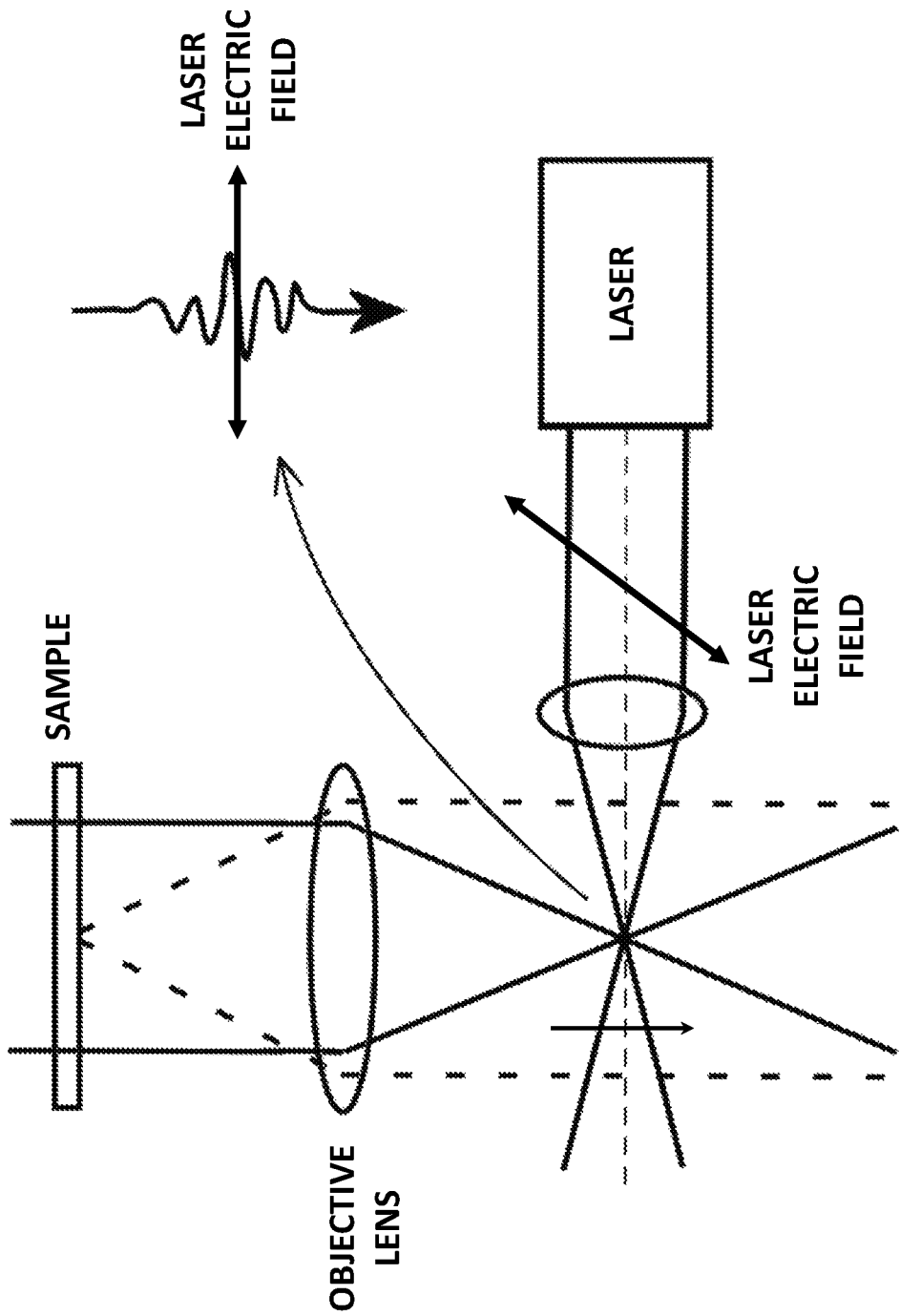
FIG. 7 is a view for explaining oscillation of the electron beams due to the irradiation of the laser beams in the prior art.

However, it is already proposed, by R. Glaser et al., to introduce the laser focus on the back focal plane of the TEM, thereby to operate the electron phase within the back surface, locally, by means of the electric field of that laser. However, in this method, as is also shown in FIG. 7, since the polarizing direction of the electron beams orthogonally intersects with the progressing or propagating direction of the electron beams; therefore, though the electron beams can swing right and left with respect to the progressing direction thereof, and thereby elongating an optical length thereof to generate the phase difference, theoretically; however, in order to obtain a necessary phase difference of about 90 degrees, it is needed to provide the laser beams having an output of several kW class, i.e., it can be seen that it is difficult to install into an actual apparatus for achieving thereof.

Due to various studies made by the inventor, it is confirmed that, the necessary phase difference of around 90 degrees can be obtained even with a laser of 5 mW class in total, if the electrons can be accelerated locally by means of an electric field of the laser while introducing laser beams focusing onto the back focus of an object lens in such a manner that the laser polarization comes to be in parallel with an axis of the laser beam. However, actually, since the electric field of the laser beam vibrates the direction thereof, alternately, at about 300 THz, e.g., the frequency of the light, in other words, then an acceleration and a deceleration are mixes with at that frequency, and further, since brightness and darkness in the phase contrast are reversed between the acceleration and the deceleration, the phase contrast is cancelled; therefore it cannot be utilized as it is.

(Advance Buncher type Laser Phase Contrast TEM)

Then, according to the present invention, the problem mentioned above is solved by projecting or irradiating the electrons, only at the timing of being accelerated (or decelerated) on the laser focus mentioned above, as shown in FIG. 1, by conducting a velocity modulation of electrons through advanced irradiation of the laser beams, and by conducting self-crowding (i.e., bunching) of the electrons, on which the velocity modulation is made; i.e., synchronization (timing adjustment) of arrival timing at a laser irradiating point on the back focal plane of the object lens with an oscillation number of the laser, by using a laser buncher, to accelerate the electrons into one (1) direction (for example, an acceleration), without mixing up with the acceleration and the deceleration, and thereby obtaining the necessary phase difference of 90 degrees mentioned above.

Although the laser beam of a visible region wavelength can be easily focused into a diameter $d=1$ μm; however, an electric power density thereof comes to $p=Pow/(\pi)(d/2)^2=2.65$ W/πm² if applying a laser of output Pow=2.1 mW, for example, but if applying an impedance of vacuum $Z_0=120\pi\Omega$, then an intensity of electric field of the laser focused comes to $E=\sqrt{(p\ Z_0)}=1$ V/μm, in general. In a case when electrons of the velocity "v" near to the beam velocity are incident upon, in the direction in parallel with this laser electric field; then the time necessary for passing through the laser focus of the diameter $d=1$ μm is approximately equal to an oscillation cycle of the laser beam (about 300 THz), i.e., the electrons can receive the acceleration/deceleration from about +1 eV down to −1 eV, in synchronism with the oscillation of the laser beam.

By paying an attention to a relationship $\gamma=1+eV/(cm^2)$ between an acceleration voltage "V" and the relativistic coefficient "γ", and a relationship $v/c=f(1-\gamma^{-2})$ between the relativistic coefficient "γ" and the velocity "v", that velocity "v" is 69.5% of the velocity $c=3.00\times10^8$ m/s, in case of the electron beams of acceleration voltage V=200 kV (a mass $m=511$ keV/c²), and then the velocity modulation "Δv" by the acceleration/deceleration of eΔv=1 eV can be obtained, as below, $\Delta v/V=(\partial v/\partial V)\times\Delta V=(v/c)^{-2}\gamma^{-3}\lambda e\Delta V/mc^2=1.50\times 10^{-6}$.

If the electrons receiving this velocity modulation ΔV perform a free movement at distance L=0.3 m, then it means that they obtain a difference of relative position, $\Delta L=L\times\Delta v/V=0.45$ μm, with respect to the electrons not receiving that modulation. As a result thereof, due to the free movement at around that distance "L", the electrons of a fast velocity which are accelerated, result to catch up the slow electrons decelerated, by the effects of both the acceleration and the deceleration alternating with each other; i.e., it can be seen that positions of the electrons are crowded (i.e., bunched) to be at a distance nearly equal to the wavelength of the laser beam (1 μm or less). Further, the timing when this electron bunch is passing through is completely synchronized with the cycle of the laser.

In the explanation given in the above, there is quoted the way of thinking of crowding (i.e., bunching), which is used in a technical field of accelerator; however, the density of electrons along the direction of the electron beams in an actual electron microscope (an averaged electron distance is given by ve/I, where "e" is an elementary charge and "I" is beam current of about several hundreds pA, and then it comes to be in the order of cm from those) is less than the density of bunch in the axial direction of the electron beam (a bunching distance comes to be as v/c times small as the wavelength of the laser, and it comes to be in sub-micron order resulting from v/c=0.659 in the case mentioned above); therefore, it is correct understanding that it is the synchronization of an incidence timing of electrons with the oscillation number of the laser, rather than the bunching of electrons.

Namely, from those mentioned in the above:

(1) A first viewpoint relating to the present invention lies in the phase contrast transmission microscope apparatus, being constructed to comprise: an electron gun to be an electron source, a first laser irradiation process for irradiating the laser beams upon the electron beams radiating from said electron source, being positioned between said electron source and an object lens, a second laser irradiation process for focusing the laser beams to be irradiated upon a focus of the electron beams passing through the specimen, being positioned on the focal plane behind said object lens, and a screen or a 2D electron beam sensor for detecting a specimen image in the form of intensity distribution of the electron beams by means of an image forming optical system.

(2) Also, in the structure mentioned in the above (1), it is important that directions of laser electric fields in the first and the second laser beam irradiating processes are in parallel with the progressing or propagating direction of the electrons, and more preferably, the first and the second laser beams are supplied, dividedly, from the same laser oscillator, thereby to achieve a function of adjusting the intensities and the relative phases of the laser beams, respectively.

(3) Namely, with the structure of the above (1), the electron beams are modulated in the velocities thereof by the laser beams irradiating before passing through the specimen, in the first laser beam irradiating process; i.e., there is provided a process for crowding the electrons in the positions thereof due to the free movement of electrons.

(4) Thereafter, within the structures mentioned in the above (1), the electron beams passing through the specimen, particularly, only the electron beams in the vicinity of the focus, are accelerated one-sidedly, or decelerated one-sidedly, through irradiation of the converged laser beams onto the focus on the back focal plane of the electron beams in the second laser beam irradiating process. On the other hand, the electron beams away from the focus are neither accelerated nor decelerated, and with this, only the electron beams in the vicinity of the focus are modulated in the phases thereof.

However, it is sufficient that an output necessary for the second laser beam to be irradiated at the focus on the back focal plane has a value, being significantly small as compared to the output that is necessary to the first laser beam for crowding or bunching. When the electron waves receiving the phase modulation in energy by eΔV propagate, freely, only by a distance L, then relative changes in the phases of electron waves can be evaluated by the Aharonov-Bohm's equation, $A=(e/h\tilde{\,})\Delta VL/v$ relating to the electric field, assuming that $h\tilde{\,}=6.58\times10^{-16}$ eVs is the converted Plank constant (Dirac constant). Namely, the minimum accelerating velocity necessary to obtain the phase difference 90 degrees can be given by $\Delta V =(\pi/2)(h\tilde{\,}/e)$ (v/L), and in case when accelerating voltage of the electron beams v=200 kV, for example, the minimum accelerating necessary at the focus of the second laser beam can be obtained by $\Delta V=1.08$ V, and the minimum laser output necessary thereto can be obtained by $P=\Delta V^2/Z_0=3.09$ fW, if assuming that the distance from the second focus of irradiation of the second laser beam up to a screen is L=20 cm.

The necessary value of the laser output at the minimum is extremely small one; however, since the phase of electrons turns back to the previous one when changing by 360 degrees, then this value may be an arbitrary number of times larger. The value of the laser output may the square of the arbitrary number multiplied by the necessary minimum value. Also, by shifting the laser phase and the timing phase of the electron bunches from the optimal values thereof, it is possible to increase the output value needed for, from the necessary minimum output value, up to that, being as an arbitrary number of times large. For this reason, it is possible to apply a laser beam of millivolt acceleration and a nanowatt output, which can be handled easily.

Figure 2:
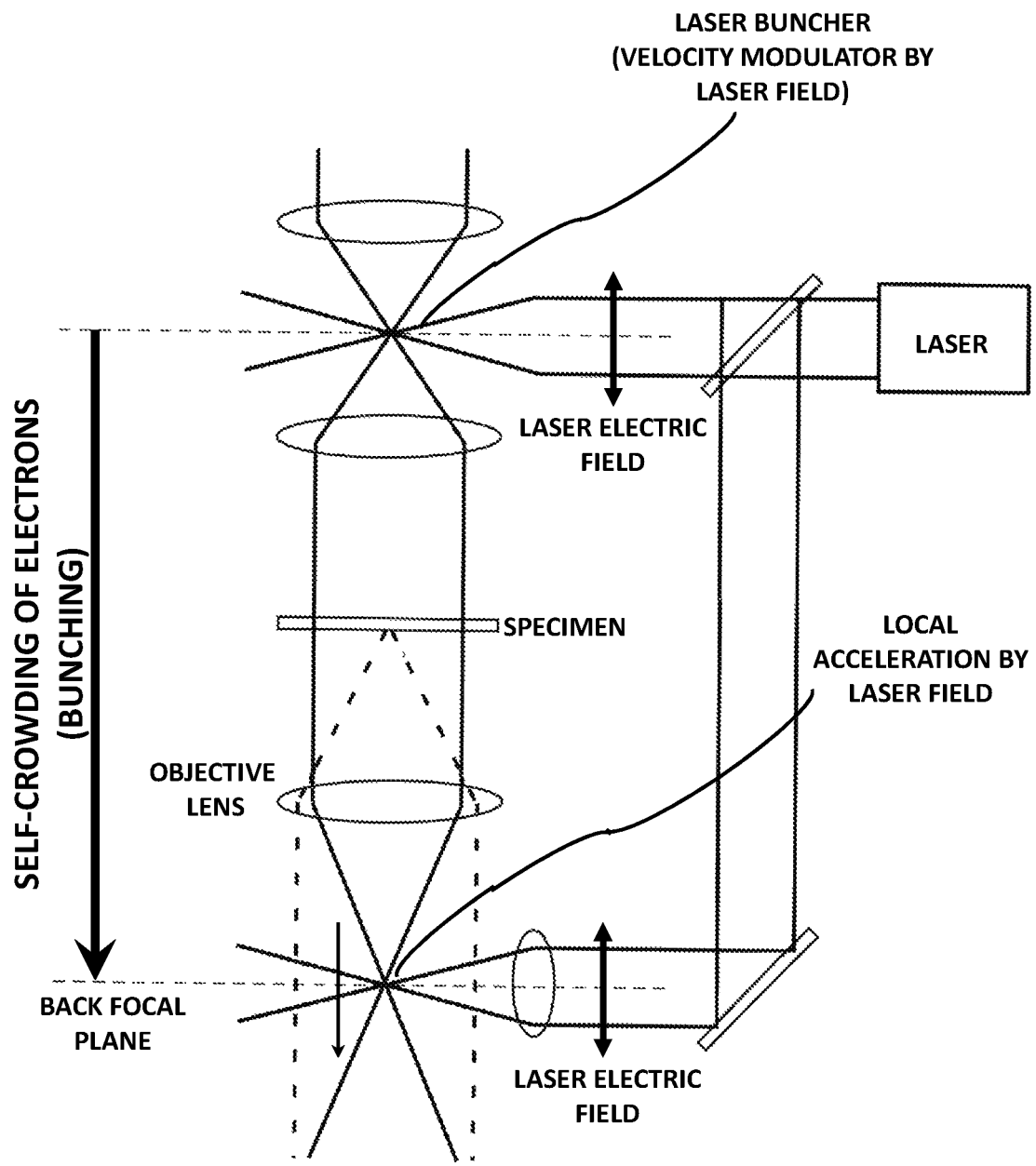
FIG. 2 is a view for explaining a variation of the phase contrast transmission electron microscope according to the present invention.

However, as more coherent installation thereof can be applied such structure, as shown in FIG. 2.

First Embodiment

Figure 3:
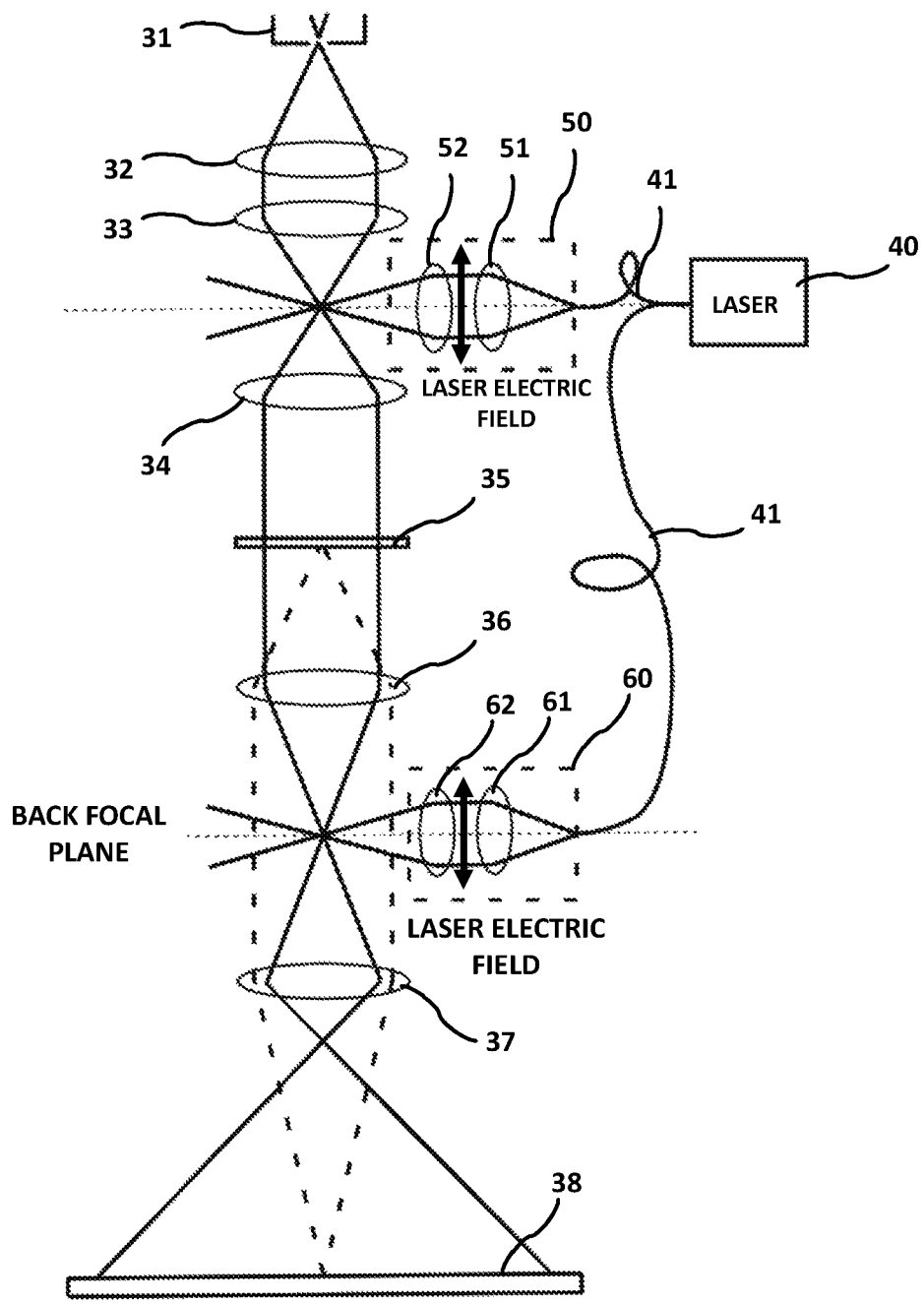
FIG. 3 is a view for showing the detailed structures of the phase contrast transmission electron microscope according to a first embodiment of the present invention.

Following to the above, detailed explanation will be given hereinafter, about the entire structure of the phase contrast transmission electron microscope mentioned above, by referring to FIG. 3. However, in the explanation given below, each of the various kinds of electron lenses constructing the electron microscope is, actually, made from an electromagnetic coil for forming an electric field, but in the explanation given below, for the purpose of simplified explanation, it is called by only a "lens", and is shown in the mode similar to a general optical lens in the figure. And, the same reference numerals are attached to the same elements throughout the entire of the explanation of the embodiments.

As apparent from the figures, the phase contrast transmission electron microscope according to an embodiment of the present invention comprises, in the similar manner to that of the general electron microscope, an electron gun 31, and a converging optical system, including a first collimate lens 32, a condenser lens 33 and a second collimate lens 34, etc., in a vacuum tube together with the electron gun 31, and further a holder base (which is shown, collectively, by reference numeral 35) for holding the specimen at a predetermined position, an object lens 36, a projection lens 37 for building up a projecting optical system, and a screen and/or a 2D detector for building up an electron detecting apparatus or device for detecting the electron beams passing through the specimen, thereby to form an image thereof.

According to the present invention, within the structures mentioned above, there is further provided a laser oscillating apparatus 40, the details of which will be explained later, wherein the laser beams from that laser oscillating apparatus 40 are supplied, through an optical fiber 41-1 for keeping a single mode, and also a polarization surface thereof, to a laser beams irradiating device 50 for use of a buncher (hereinafter, "a bunching laser beams irradiating device") and a laser beam irradiating device 60 for use of phase adjustment (hereinafter, "a phase adjusting laser beam irradiating device"), respectively, thereby to be irradiated upon the electrons.

The bunching laser beam irradiating device 50 has a function of irradiating laser beams, being polarized into the direction of the electric field in parallel with the progressing or propagating direction of the electron beams (see an arrow in the figure), upon the electron beams, as the entire thereof, being discharged or radiated from the electron gun 31. Further, in the present example, said bunching laser beam irradiating device 50 comprises a collimate lens 51 and a condenser lens 52, etc., and is positioned along the focal plane of the condenser lens 33 for condensing the electron beams from the electron gun 31. With this, the polarized laser beams from the optical fiber 41-1 are focused and irradiated upon the electron beams, which are focused into a focal point.

As a result of that, by the electric field alternating at the frequency of the laser beams irradiating from the bunching laser irradiating device 50 mentioned above, the electron beams are alternately accelerated (or decelerated) at the frequency of that laser beams, and in other words, the electron beams result to be modulated in the velocity thereof at the frequency of the laser beams. Further, the electron beams, being modulated in the velocity thereof in this manner, are bunching, spontaneously, along with the progression inside the tube of the microscope. A cycle of passing-by for a group of the electrons coincides with the oscillating number of the laser beams.

Thereafter, the bunching electron beams pass through the specimen, as is shown in the figure, by the function of the object lens 36 on the back focal plane, and diffraction pattern(s) due to the specimen appear, together with a focus of the electron beams.

On the other hand, the phase adjusting laser beam irradiating device 60 has also a function of, similarly, irradiating the laser beams, being supplied from the laser generating apparatus 40 through an optical fiber 41-2 and being polarized into the direction of the electric field in parallel with the progressing direction of the electron beams, upon the electron beams, which are focused on the back focal point by the object lens 36 mentioned above. Further, in the present example, also, said phase adjusting laser beam irradiating device 60 has a collimate lens and/or a condenser lens 62, etc., in the similar manner to the abovementioned bunching laser beam irradiating device 50, and it is positioned along with (or, in the vicinity of) the back focal plane of the object lens 36. With this, the laser beams from the optical fiber 41-2, which are polarized are focused, are irradiated only upon the focus of the electron beams. Namely, since the cycle of passing-by for the group of the electrons coincides with the oscillation number of the laser, in the process of laser beam irradiation by the phase adjusting laser beam irradiating device 60, then only the electrons in the vicinity of the focus are accelerated (or decelerated) one-sidedly, and with this, it is possible to obtain the necessary phase difference of 90 degrees.

However, in the structures mentioned above, the bunching laser beam irradiating device 50 and the phase adjusting laser beam irradiating device 60 are constructed in such a manner that each irradiates the laser beams that are produced by means of a single laser oscillator having a coherent length longer than that of a TEM column (for example, 300 m or longer than that in the present example). Also, the bunching by means of the bunching laser beam irradiating device 50 is determined in such a manner that it reaches to the maximum at an irradiating portion of the phase adjusting laser beam irradiating device 60.

Figure 4:
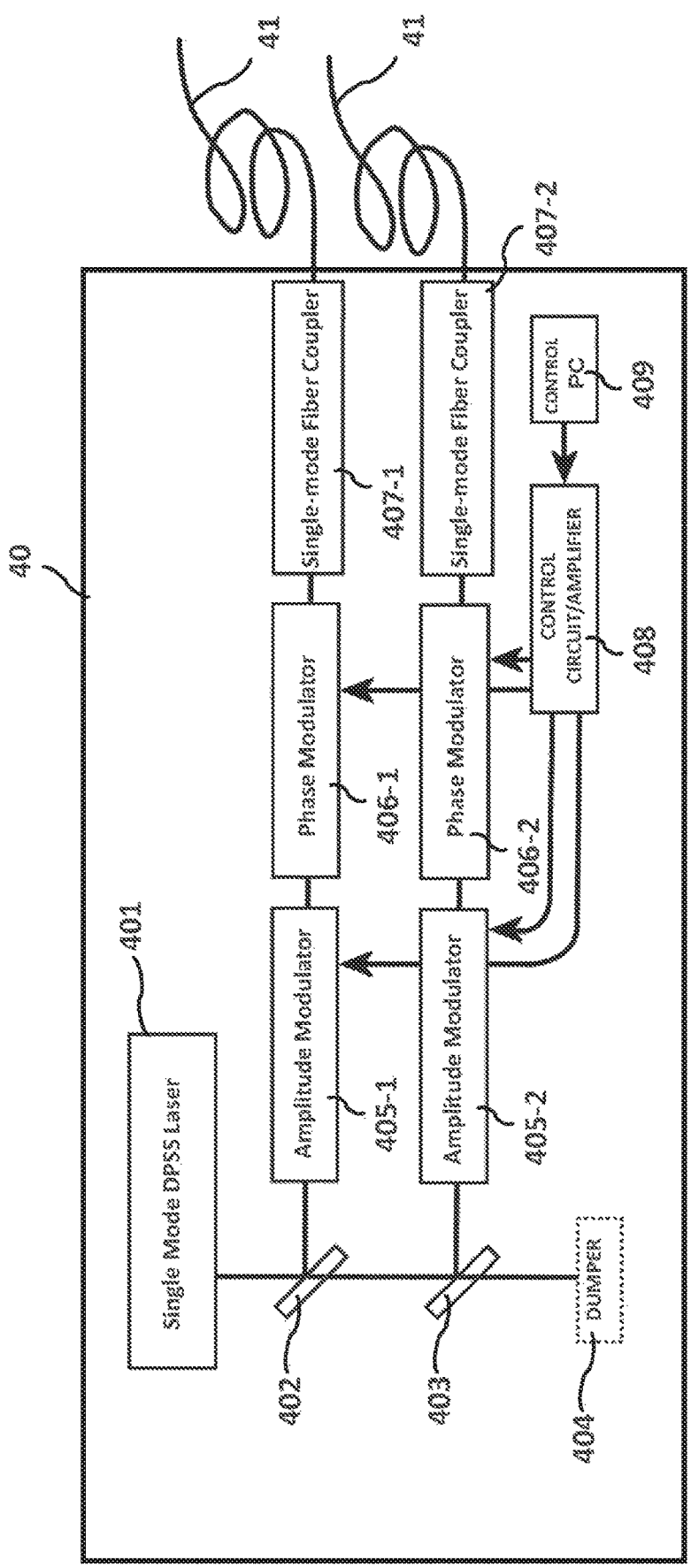
FIG. 4 is a block diagram for showing the detailed structures of a laser oscillating apparatus of the phase contrast transmission electron microscope mentioned above.

Herein, an example of detailed structures of the laser oscillating apparatus 40 mentioned above is shown in FIG. 4. As is apparent from this figure, the laser oscillating apparatus 40 includes a single-mode DPSS laser oscillator 401, a half mirrors 402 and 403, and a dumper 404. However, in the present example is applied a Single Mode DPSS Laser LASOS GLK-532-300® having an output of 300 mW at wavelength of 532 nm, for example. The laser oscillation from this laser oscillator 401 is absorbed into the dumper 404, after being reflected and divided in a part thereof, respectively, upon the half mirrors 402 and 403, which can selectively reflect only a desired polarized component thereupon, such as, a dichroic mirror, etc., for example. In this manner, with applying the same laser oscillator and plural numbers of spectral diffraction mirrors, it is possible to obtain plural numbers of the laser beams, each having the same phase and being polarized into desired directions, by means of relatively simple structures thereof. Also, in the present example, as the half mirrors 402 and 403 are adopted UVFS Beam splitter Newport 10Q40BS, 1×2®.

The laser beams reflecting upon the half mirror 402 are modulated into the desired intensity and also the phase thereof, within an amplitude modulator 405-1 and a phase modulator 406-1, on a first stage, and are coupled to the optical fiber 41-1 mentioned above through a coupler 407-1. And, the laser beams reflecting upon the half mirror 403 is also modulated into the desired intensity and the phase thereof, within an amplitude modulator 405-2 and a phase modulator 406-2, on a second stage, and are coupled to the optical fiber 41-2 mentioned above through a coupler 407-2. Further, herein, as the amplitude modulators 405-1 and 405-2 is adopted Amplitude Modulator Newport 4102 NF®, as the phase modulators 406-1 and 406-2 is adopted Phase Modulator Newport 4002®, and as the couplers are adopted Single Mode Fiber Coupler Newport F91-C1®, respectively. Also, as the optical fibers 41-1 and 41-2 mentioned above are adopted Pol. Maint. Fiber Coupling F-PM480®.

The laser oscillating apparatus 40 mentioned above further comprises a control circuit/amplifier 407 for controlling the amplitude modulators 405-1 and 405-2 and the phase modulators 406-1 and 406-2 mentioned above, and a control PC 409 as a controller thereof. However, herein, the laser beams from the structures of the first stage mentioned above (e.g., the amplitude modulator 405-1, the phase modulators 406-1, and the coupler 407-1) are guided to the bunching laser beam irradiating device 50 mentioned above through the optical fibers 41-1, while the laser beams from the structures of the second stage mentioned above (e.g., the amplitude modulator 405-2, the phase modulators 406-2, and the coupler 407-2) are guided to the phase modulating laser beam irradiating device 60 mentioned above through the optical fibers 41-2, respectively. Namely, through adjustments of parameters of those two (2) pieces of irradiating laser beams, it is possible to determine an amount or quantity of change in the phase at the position near the focus of the electron beams, arbitrary.

With such structures of the laser oscillating apparatus 40 mentioned above, it is possible to change the relative phased of the laser beams supplied to the bunching laser beam irradiating device 50, by means of the amplitude modulator 405-1 and the phase modulators 406-1 on the first stage, and also to change the intensity of the laser beams supplied to the phase modulating laser beam irradiating device 60, by means of the amplitude modulator 405-2 and the phase modulators 406-2 on the second stage, respectively. Namely, by adjusting the intensity of the laser beams in the first and the second laser irradiating processes mentioned above, it is possible to adjust the phases of the electron beams in the vicinity of the focus on the back focal plane of the object lens, in non-contact manner. In other words, it is possible to obtain an effect equal or similar to that of the conventional Zernike phase plate. In that instance, also there is no process of losing the electron beams therein, and thereby it is possible to minimize the dose of electron beams on the specimen.

Also, the relative phases and/or the intensities of the irradiating laser beams are in such quantities that they can be controlled at high speed, and due to this, a quantity of the phase modulation of the electron beams is also controllable at high speed in the similar manner. For this reason, it is also possible to obtain both, the phase and the amplitude of the electron beams passing through the specimen in a short time period. Namely, with this, it is possible to achieve complex image measurement of measuring the phase and the amplitude of the penetrating electron beams at the same time, and thereby to correct an out-focusing due to an image processing after photographing an image.

Also, by photographing three (3) pieces of an image, or more than that, while changing the phase modulation quantity, it is possible to obtain a distribution of quantity, which is called "visibility", of indicating a volume of the amplitude of an amount or quantity of changes in the contrast at each point with respect to continuous phase modulation, i.e., a "visibility image".

Also, with the phase contrast transmission electron microscope, the details of which was mentioned in the above, it is possible to obtain the required phase difference of 90 degrees by modulating the phase of only the electron beams passing through, without losing the electron beams scattered on the specimen, on the back focal plane of the object lens in the transmission electron microscope; therefore, it is possible to achieve a high contrast (=change of quantity of s by the specimen/quantity of back s).

Second Embodiment

In the embodiment mentioned above, the bunching laser beam irradiating device 50 is positioned between the electron gun 31, the electron source, and the object lens 36, in more details, being disposed corresponding to the focus position of the condenser lens 33 near the electron gun 31, and the bunching through irradiation of said bunching laser beams is so determined that it comes to the maximum at an irradiating portion of the phase modulating laser beam irradiating device 60. However, onto the object lens 36 mentioned above are projected the electron beams, which are modulated in the velocity thereof by the laser, therefore it has a drawback, too, that it can be ill influenced easily, due to chromatic aberrations of the object lens 36 mentioned above.

Figure 5:
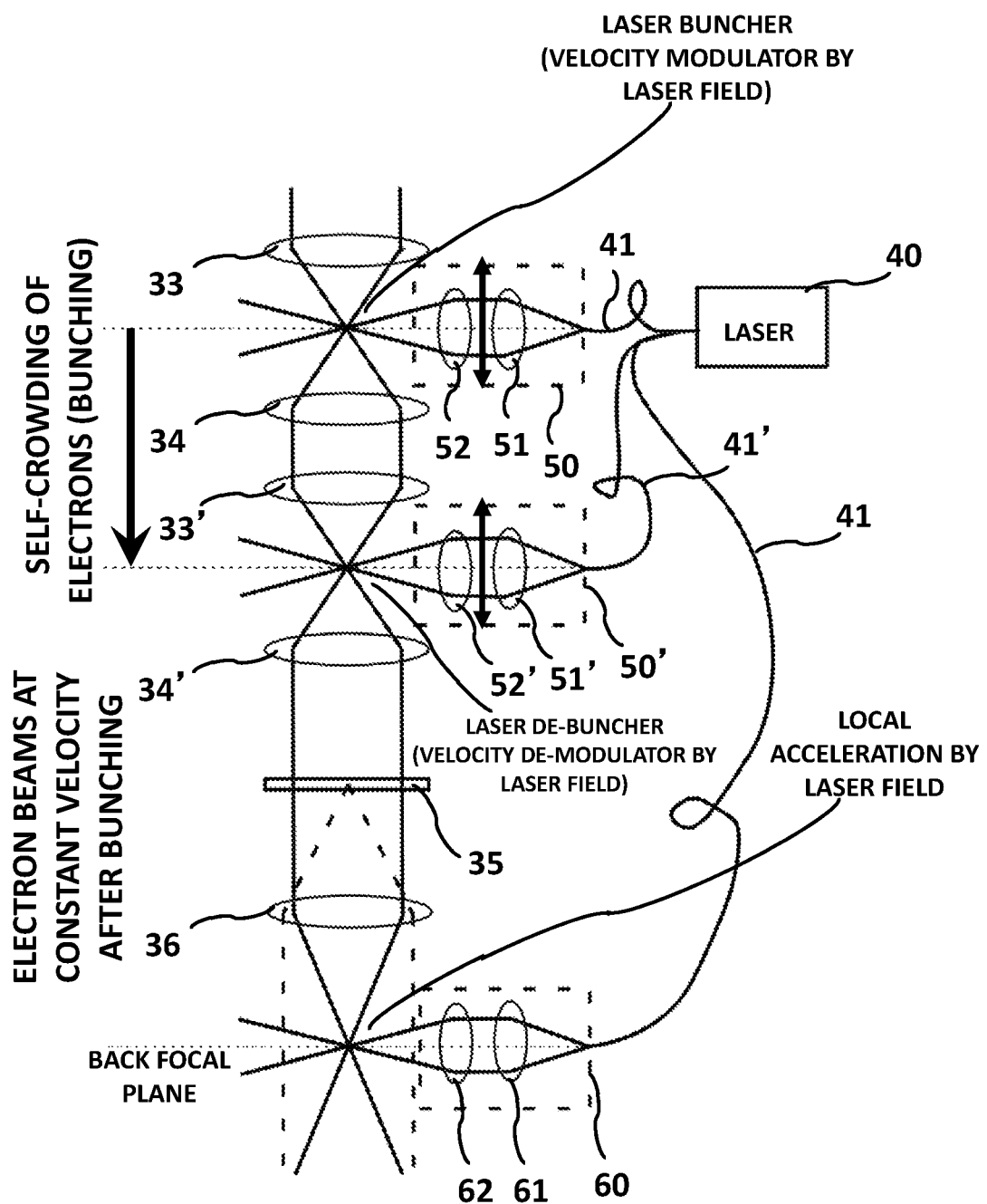
FIG. 5 is a view for showing the detailed structures of the phase contrast transmission electron microscope according to a second embodiment of the present invention.
Figure 6:
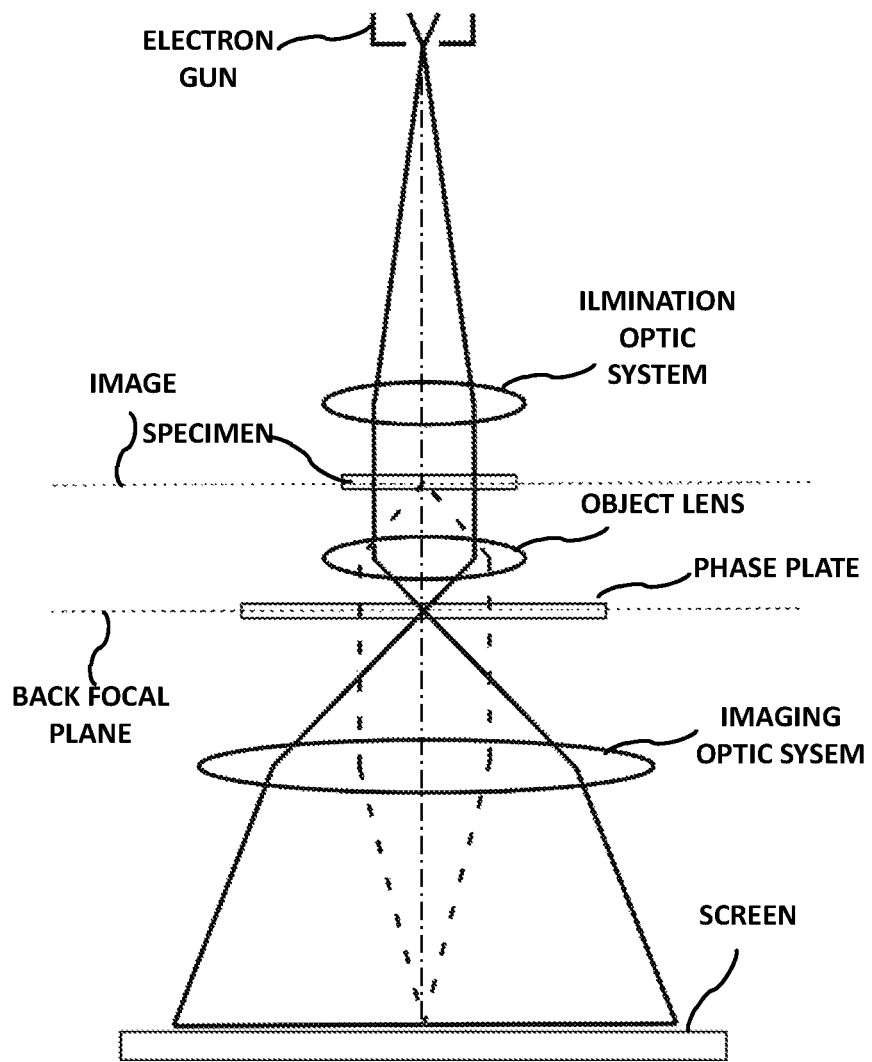
FIG. 6 is a view for showing the detailed structures of the phase contrast transmission electron microscope according to the prior art.

Then, in the phase contrast transmission electron microscope according to the second embodiment of the present invention, for solving the drawback mentioned above, the region for the self-crowding (bunching) of the electrons by means of bunching laser beam irradiating device 50 mentioned above is restricted or limited to a predetermined region, so as to project the bunched electron beams at a constant velocity onto the object lens, and this is shown in FIG. 5.

As is apparent from the drawing, in the phase contrast transmission electron microscope according to this second embodiment, there is further conducted so-called de-bunching, for turning the velocity modulation back to before. In more details, under the second collimate lens 34, there are further provided a second condenser lens 33' and a third collimator lens 34', wherein the laser beam for de-bunching is irradiated upon the electron beam, which is bunched by the bunching laser beam irradiating device 50, by means of a de-bunching laser beam irradiating device 50'. Thus, by means of irradiation of the laser beams for de-bunching, the velocity modulation of the electron beam, which was once self-crowded (bunched) by the bunching laser beam irradiating device 50, is turned back to the previous, and thereby obtaining the electron beams after the self-crowding (bunching) having constant velocity.

Thereafter, the electron beam after the self-crowding (bunching) passes through the specimen, a diffraction pattern due to the specimen appears, together with the focus of the electron beams, on the back focal plane, by the function of the object lens 36. Thereafter, in the similar manner to that mentioned above, those are detected by an electron detecting device or apparatus 38 constructed with the screen or the 2D detector, so as to form an image, However, in this instance, the de-bunching laser beam irradiating device 50' also comprises a collimator lens 51' and a condenser lens 52', similar to the bunching laser beam irradiating device 50' mentioned above, and has a function of irradiating the laser beam being polarized into the direction of the electric field in parallel with the propagating direction of the electron beam, which is supplied from the laser oscillating apparatus 40 through an optical fiber 41-1' (see an arrow in the figure), onto the electron beam, which is converged at the back focus of the second condenser lens 33' However, in this instance, it is apparent for the person skilled in the art that the laser oscillating apparatus 40 may further comprises an amplitude modulator, a phase modulator and a coupler at third stage, though not shown in the figure herein, in addition to those shown in FIG. 4, and that an output thereof may be coupled to the optical fiber 41-1'.

As was mentioned in detail in the above, with the phase contrast transmission electron microscope apparatus according to the present invention, it is possible to achieve the function(s) of the phase plate to be applied in the conventional phase contrast electron microscopy, in non-contact manner, by using the laser beam. With this, there is no necessity of heating to high temperature (for example, 300° C.) that was necessary for preventing static electricity on the conventional phase plate, and therefore, it is possible to achieve the electron microscope apparatus for solving thermal load to the specimen to be located near to said phase plate, in particular, a frozen specimen (for example, −196° C.), i.e., being applicable in a wide field, and being superior in operability thereof.

Also, differing from the conventional phase plate, since the necessary phase difference in the electron beams can be achieved, in non-contact manner, with using the laser beams, there is caused no such damage, as is caused in the phase plate, and is semi-permanently usable, and further since the phase changes thereof are also controllable, it is possible to minimize the dose of electron beams on the specimen, other than to easily enable a complex phase imaging and a visibility imaging.

In the above, description was given about the phase contrast transmission electron microscope according to the embodiment of the present invention. However, the present invention should not be restricted to those embodiments mentioned above; but may include various variation(s) thereof. For example, the embodiments mentioned above are given about the system as a whole thereof, for explaining the present invention, easily understandable, but it should not be limited, necessarily, only to that having all of the constituent elements explained in the above. Also, it is possible to add the constituent element(s) of other embodiment(s) to the constituent elements of a certain embodiment. Further, to/from/for a part of the constituent elements of each embodiment can be added/deleted/substituted other constituent element(s).

EXPLANATION OF THE MARKS

31 . . . electron gun, 32, 32', 33, 33', 34 . . . irradiating optical system, 35 . . . specimen, 36 . . . object lens, 37 . . . projection optical system, 38 . . . detecting apparatus, 40 . . . laser oscillating apparatus, 41-1, 41-1', 41-2 . . . optical fiber, 50 . . . bunching laser beam irradiating device, 50' . . . de-bunching laser beam irradiating device, 51, 52, 51', 52', 61, 62 . . . converging laser irradiating system, 60 . . . phase adjusting laser beam irradiating device.

The invention claimed is:

1. A phase contrast transmission microscope apparatus, comprising:
    an electron source configured to radiate an electron beam in a propagating direction;
    an object lens;
    a first condenser lens to focus the electron beam radiated from said electron source, positioned between said electron source and said object lens;
    a specimen holder base configured to hold a specimen thereon, positioned between said first condenser lens and said object lens;
    an image forming optical system positioned downstream of said object lens in the propagating direction;
    an electron beam sensor configured to detect a specimen image that corresponds to a distribution of intensities of the electron beam from the image forming optical system;
    a first laser beam irradiating device configured to irradiate a first laser beam, having a direction of an electric field which is parallel with the propagating direction of the electron beam, onto said electron beams beam at a focal plane of said object lens which is downstream from said object lens in the propagating direction; and
    a second laser beam irradiating device configured to irradiate a second laser beam, having a direction of an electric field which is parallel with the propagating direction of the electron beam, onto said electron beam at a focal plane of said first condenser lens.

2. The phase contrast transmission microscope apparatus according to claim 1, wherein the first laser beam from said first laser beam irradiating device and the second laser beam from said second laser beam irradiating device are generated from a same laser oscillator.

3. The phase contrast transmission microscope apparatus according to claim 2, wherein said same laser oscillator is a single mode laser oscillator.

4. The phase contrast transmission microscope apparatus according to claim 3, wherein a single mode laser of the single mode laser oscillator has a coherent length that is longer than that of a TEM column.

5. The phase contrast transmission microscope apparatus according to claim 2, further comprising:
    a second condenser lens to focus the electron beam, and positioned between a downstream side of irradiation of the laser beam by said second laser beam irradiating device and said specimen holder base;

a third laser beam irradiating device configured to irradiate a third laser beam onto said electron beam at a focal plane of said second condenser lens before said electron beam passes through said specimen.

6. The phase contrast transmission microscope apparatus according to claim 5, wherein the third laser beam from said third laser beam irradiating device has a direction of an electric field which is parallel with the propagating direction of said electron beam.

7. The phase contrast transmission microscope apparatus according to claim 6, wherein the first laser beam from said first laser beam irradiating device, the second laser beam from said second laser beam irradiating device, and the third laser beam from said third laser beam irradiating device are generated from a same laser oscillator.

8. The phase contrast transmission microscope apparatus according to claim 7, wherein said same laser oscillator is a single mode laser oscillator.

9. The phase contrast transmission microscope apparatus, according to claim 8, wherein a single mode laser of the single mode laser oscillator has a coherent length longer than that of a TEM column.

10. The phase contrast transmission microscope apparatus according to claim 7, wherein relative phases among the first, second and third laser beams are controllable independently, and powers of the first, second and third laser beams are controllable independently.

11. The phase contrast transmission microscope apparatus according to claim 2, wherein a relative phase between the first laser beam and the second laser beam is controllable, and powers of both the first and second laser beams are controllable independently.

12. The phase contrast transmission microscope apparatus according to claim 1, wherein said electron beam sensor is a screen-type or a 2D electron beam sensor.

* * * * *